(12) United States Patent
Mills et al.

(10) Patent No.: US 8,514,552 B2
(45) Date of Patent: Aug. 20, 2013

(54) ELECTRICAL SYSTEM AND MATRIX ASSEMBLY THEREFOR

(75) Inventors: Patrick Wellington Mills, Bradenton, FL (US); James Michael McCormick, Bradenton, FL (US); Kevin Francis Hanley, Bradenton, FL (US); Timothy Richey Budd, Bradenton, FL (US)

(73) Assignee: Eaton Corporation, Cleveland, OH (US)

( * ) Notice: Subject to any disclaimer, the term of this patent is extended or adjusted under 35 U.S.C. 154(b) by 381 days.

(21) Appl. No.: 12/971,142

(22) Filed: Dec. 17, 2010

(65) Prior Publication Data

US 2012/0154987 A1 Jun. 21, 2012

(51) Int. Cl.
*H02B 1/26* (2006.01)
*H05K 7/20* (2006.01)

(52) U.S. Cl.
USPC ............ 361/644; 361/676; 361/707; 361/709

(58) Field of Classification Search
USPC ......................................... 361/644, 676–678
See application file for complete search history.

(56) References Cited

U.S. PATENT DOCUMENTS

| | | | |
|---|---|---|---|
| 2,986,676 A * | 5/1961 | Edmunds ...................... 361/636 |
| 5,102,342 A | 4/1992 | Marian | |
| 5,959,839 A | 9/1999 | Gates | |
| 5,980,312 A | 11/1999 | Chapman et al. | |
| 6,645,344 B2 | 11/2003 | Caldwell et al. | |
| 6,788,867 B2 | 9/2004 | Mule et al. | |
| 6,868,602 B2 | 3/2005 | McCullough | |
| 6,898,072 B2 | 5/2005 | Beihoff et al. | |
| 7,095,612 B2 | 8/2006 | Beihoff et al. | |
| 7,170,376 B2 | 1/2007 | Mills et al. | |
| 7,476,108 B2 | 1/2009 | Swain et al. | |
| 7,578,950 B2 | 8/2009 | Kirchner et al. | |

(Continued)

FOREIGN PATENT DOCUMENTS

| | | |
|---|---|---|
| EP | 1 037 517 A2 | 9/2000 |
| EP | 1 545 180 A2 | 6/2005 |
| FR | 2 614 478 A1 | 10/1988 |

OTHER PUBLICATIONS

"Thermally Conductive Polymers for Thermal Management and EMI Shielding", http://www.coolpolymers.com/heattrans.html, Nov. 4, 2010, pp. 1-6.

(Continued)

*Primary Examiner* — Gregory Thompson
(74) *Attorney, Agent, or Firm* — Eckert Seamans Cherin & Mellott, LLC; Grant E. Coffield

(57) ABSTRACT

A matrix assembly is provided for an electrical system such as, for example, a power distribution unit for an aircraft. The electrical system includes an enclosure and a number of current carrying components such as, for example, electrical bus members, electrical switching apparatus, and/or fuses. The matrix assembly includes a matrix member having a generally planar portion, a plurality of attachment points for attaching the current carrying components to the generally planar portion, and a plurality of mounting points for attaching the generally planar portion to a thermally conductive structure such as, for example, an aluminum airframe structure. The matrix member is a thermally conductive liquid crystalline polymer. In addition to providing dielectric insulation, the matrix member also effectively transfers heat away from the current carrying components to the aluminum airframe structure, thereby reducing the temperature and corresponding electrical resistance within the electrical system and improving performance.

15 Claims, 6 Drawing Sheets

(56) References Cited

U.S. PATENT DOCUMENTS

| | | |
|---|---|---|
| 7,593,230 B2 | 9/2009 | Abul-Haj et al. |
| 7,751,192 B2 | 7/2010 | Abul-Haj et al. |
| 2004/0066643 A1* | 4/2004 | Beihoff et al. ............... 361/816 |
| 2006/0164811 A1 | 7/2006 | Maxwell et al. |
| 2010/0039773 A1* | 2/2010 | Tilton et al. ............... 361/699 |

OTHER PUBLICATIONS

Cool Polymers, Inc., CoolPoly D5506 Thermally Conductive Liquid Crystalline Polymer (LCP), www.coolpolymers.com, Sep. 7, 2007, p. 1.

European Patent Office, "International search report and Written Opinion", Jun. 4, 2012, 19 pp.

* cited by examiner

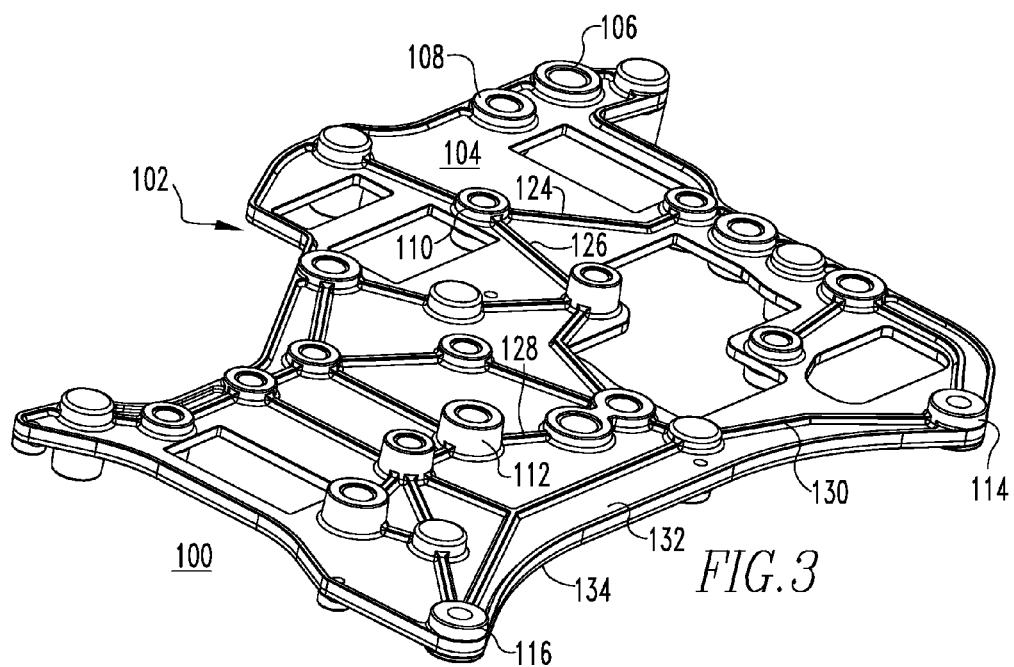
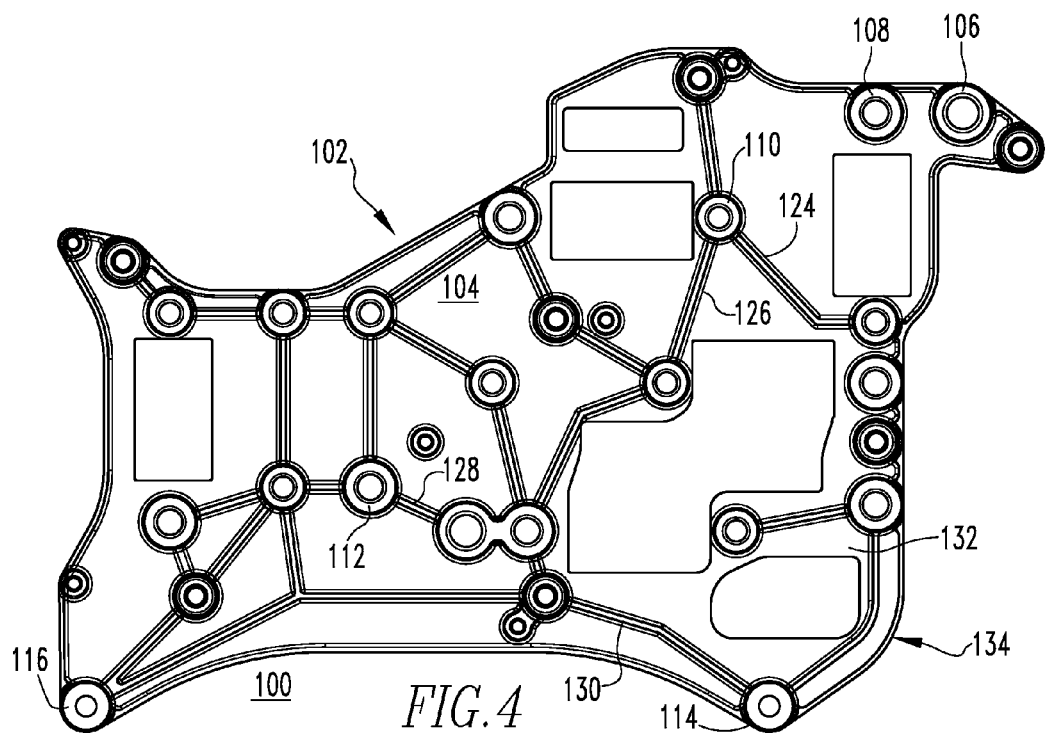

ELECTRICAL SYSTEM AND MATRIX ASSEMBLY THEREFOR

CROSS-REFERENCE TO RELATED APPLICATION

This application is related to commonly assigned, concurrently filed U.S. patent application Ser. No. 12/971,558, filed Dec. 17, 2010, and entitled "ELECTRICAL SYSTEM, AND CIRCUIT PROTECTION MODULE AND ELECTRICAL SWITCHING APPARATUS THEREFOR".

BACKGROUND

1. Field

The disclosed concept relates generally to electrical systems and, more particularly, to aerospace electrical systems, such as, for example, power distribution units. The disclosed concept also relates to matrix assemblies for aerospace electrical systems.

2. Background Information

Aircraft or aerospace electrical systems generate, regulate and/or distribute power throughout an aircraft.

Aerospace power distribution units (PDUs), for example, generally include an enclosure, a number of input and output connectors, internal electrical bussing, electrical conductors, a number of electrical switching apparatus, such as contactors, circuit breakers, relays and the like and/or fuses. More specifically, in aircraft or aerospace electrical systems relatively small circuit breakers, commonly referred to as subminiature or aircraft circuit breakers, are often used to protect electrical circuitry from damage due to an overcurrent condition, such as an overload condition or a relatively high level short circuit or fault condition. Aircraft circuit breakers also often serve as switches for turning equipment on and off, and are grouped together as part of a circuit protection module with the circuit breakers/switches being accessible on an outer panel of the enclosure, within the aircraft.

Within the enclosure, a backplane made of melamine or a suitable thermoset compound is typically employed to meet dielectric insulation requirements and suitably separate and isolate the electrical components. However, significant heat is generated in aircraft electrical systems, which increases resistivity and adversely affects system performance. For example, for a contactor with a voltage drop of 0.105 V for two contact points and a load current of 400 A, the total heat generation is 42 W or 21 W per contact. The electromagnetic coil of the contactor is also a source of heat generation. Likewise, fuses generate heat. For example, for a fuse with a voltage drop of 0.1 V and a load current of 260 A, the volumetric heat generation is 26 W. While the melamine or thermoset material of the backplane generally serves well as an effective electrical insulator, it is thermally insulative and, therefore, prevents good heat transfer to free air or the aircraft structure.

There is room for improvement in aerospace electrical systems and matrix assemblies therefor.

SUMMARY

These needs and others are met by embodiments of the disclosed concept, which are directed to a matrix assembly for an electrical system. Among other benefits, the matrix assembly provides both effective dielectric insulation and heat transfer to the surrounding aircraft structure.

As one aspect of the disclosed concept, a matrix assembly is provided for an electrical system. The electrical system comprises an enclosure and a number of current carrying components housed by the enclosure. The matrix assembly comprises: a matrix member comprising a generally planar portion, a plurality of attachment points structured to attach the current carrying components to the generally planar portion, and a plurality of mounting points structured to attach the generally planar portion to a thermally conductive structure. The matrix member is a thermally conductive liquid crystalline polymer.

The thermally conductive liquid crystalline polymer may have a thermal conductivity of about 1 W/mK to about 20 W/mK, and may be structured to provide heat transfer and dielectric insulation, without requiring a plurality of separate structures.

The enclosure may include an interior and an exterior, wherein a portion of the matrix member is structured to extend outwardly from the interior of the enclosure to the exterior of the enclosure, and wherein the mounting points are structured to be disposed on the exterior of the enclosure. The mounting points may be structured to be attached to an airframe structure, wherein the matrix member is structured to transfer heat away from the current carrying components disposed on the interior of the enclosure through the matrix member to the exterior of the enclosure and through the mounting points to the airframe structure.

An electrical system employing the aforementioned matrix assembly is also disclosed. The electrical system may be a power distribution unit for an aircraft, wherein the aircraft has an aluminum airframe structure. The current carrying components may generate heat within the interior of the power distribution unit, and the matrix member of the matrix assembly may transfer the heat from the power distribution unit to the aluminum airframe structure.

BRIEF DESCRIPTION OF THE DRAWINGS

A full understanding of the disclosed concept can be gained from the following description of the preferred embodiments when read in conjunction with the accompanying drawings in which:

FIG. 3 is an isometric view of the matrix member of the matrix assembly of FIG. 2;

FIG. 4 is a top plan view of the matrix member of FIG. 3;

DESCRIPTION OF THE PREFERRED EMBODIMENTS

For purposes of illustration, the disclosed concept is described herein in association with subminiature or aircraft circuit breakers, although it will become apparent that the disclosed concept is applicable to a wide range of different electrical apparatus (e.g., without limitation, electrical conductors; electrical bus members; fuses) including electrical switching apparatus (e.g., without limitation, circuit breakers; relays; contactors) for a wide range of different applications. Such electrical apparatus can be employed, for example and without limitation, in aircraft alternating current (AC) systems having a typical frequency of about 400 Hz, but can also be used in direct current (DC) systems. It will also become evident that the disclosed concept is applicable to other types of electrical systems including, for example and without limitation, circuit breaker panels or circuit protection modules used in AC systems operating at other frequencies; to larger circuit breakers, such as miniature residential or commercial circuit breakers; and to a wide range of circuit breaker applications, such as, for example, residential, commercial, industrial, aerospace, and automotive.

As employed herein, the term "number" shall mean one or an integer greater than one (i.e., a plurality).

As employed herein, the term "fastener" refers to any suitable connecting or tightening mechanism expressly including, but not limited to, screws, bolts and the combinations of bolts and nuts (e.g., without limitation, lock nuts) and bolts, washers and nuts.

As employed herein, the term "electrical conductor" shall mean a wire (e.g., solid; stranded; insulated; non-insulated), a copper conductor, an aluminum conductor, a suitable metal conductor, or other suitable material or object that permits an electric current to flow easily.

As employed herein, the statement that two or more parts are "connected" or "coupled" together shall mean that the parts are joined together either directly or joined through one or more intermediate parts. Further, as employed herein, the statement that two or more parts are "attached" shall mean that the parts are joined together directly.

As employed herein, the term "liquid crystalline polymer" shall mean a moldable (e.g., without limitation, by injection molding) material that is both thermally conductive and electrically non-conductive (e.g., an electrical insulator) exhibiting dielectric properties and expressly includes, but is not limited to, CoolPoly® D5506, which is available from Cool Polymers, Inc. having a place of business at 51 Circuit Drive, North Kingstown, R.I. 02852.

As employed herein, the term "managed" or "manages" shall mean handled or directed with a degree of skill, worked upon or tired to alter for a purpose, or succeeded in accomplishing or achieved a purpose.

Figure 1:
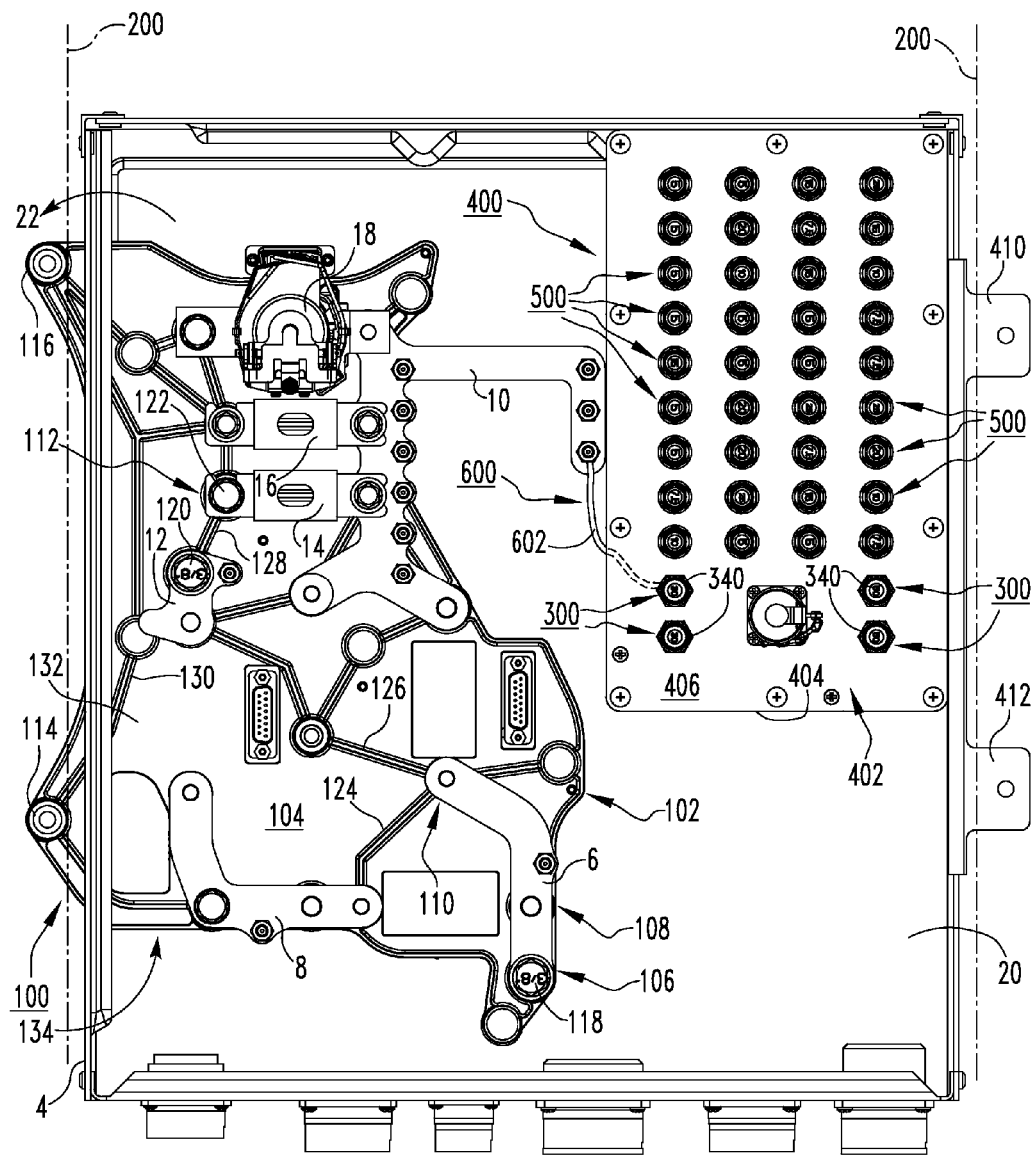
FIG. 1 is top plan view of an electrical system and matrix assembly therefor, in accordance with an embodiment of the disclose concept, with the cover of the electrical system enclosure removed to show internal structures.
Figure 2:
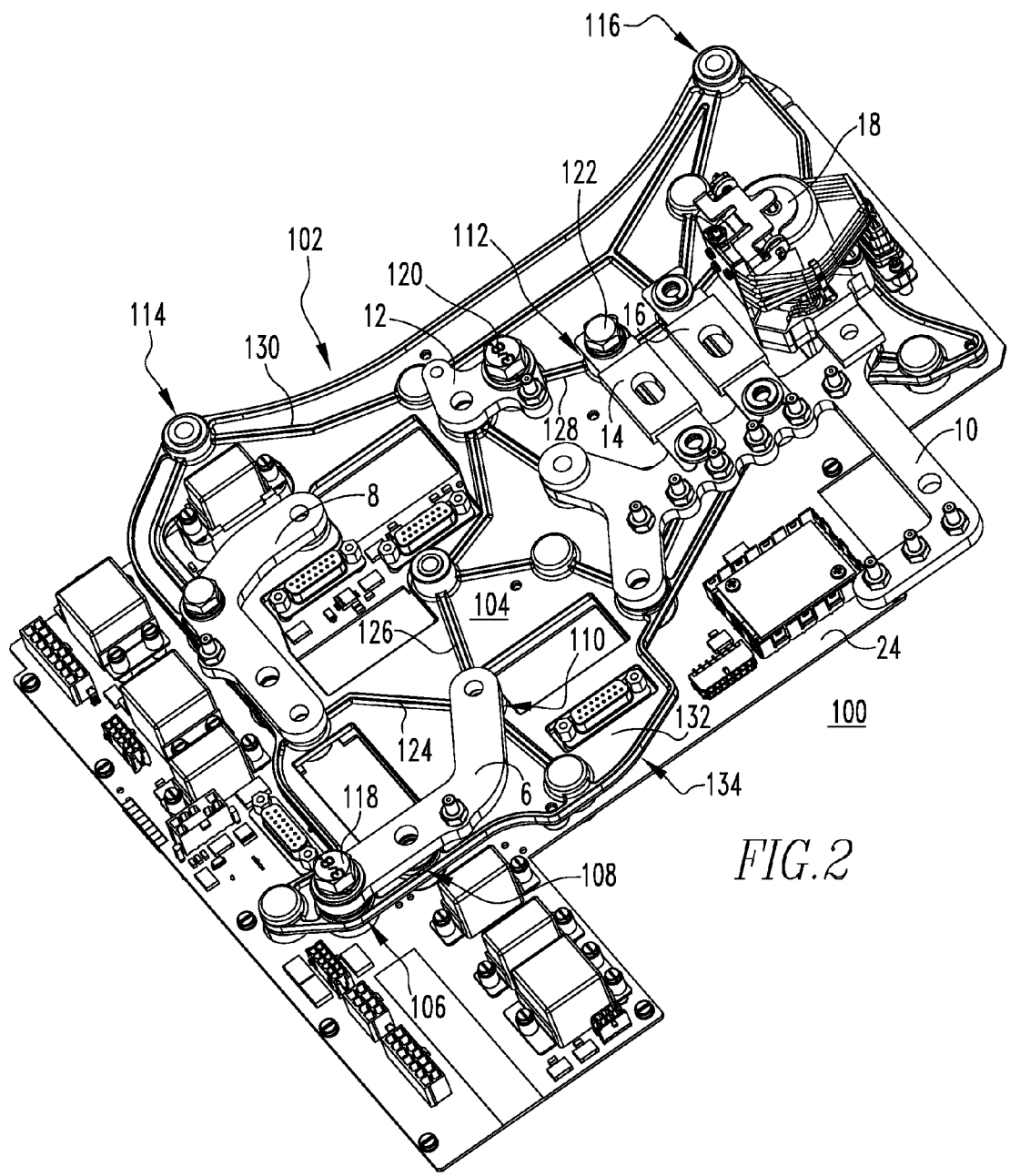
FIG. 2 is an isometric view of the matrix assembly of FIG. 1.
Figure 5:
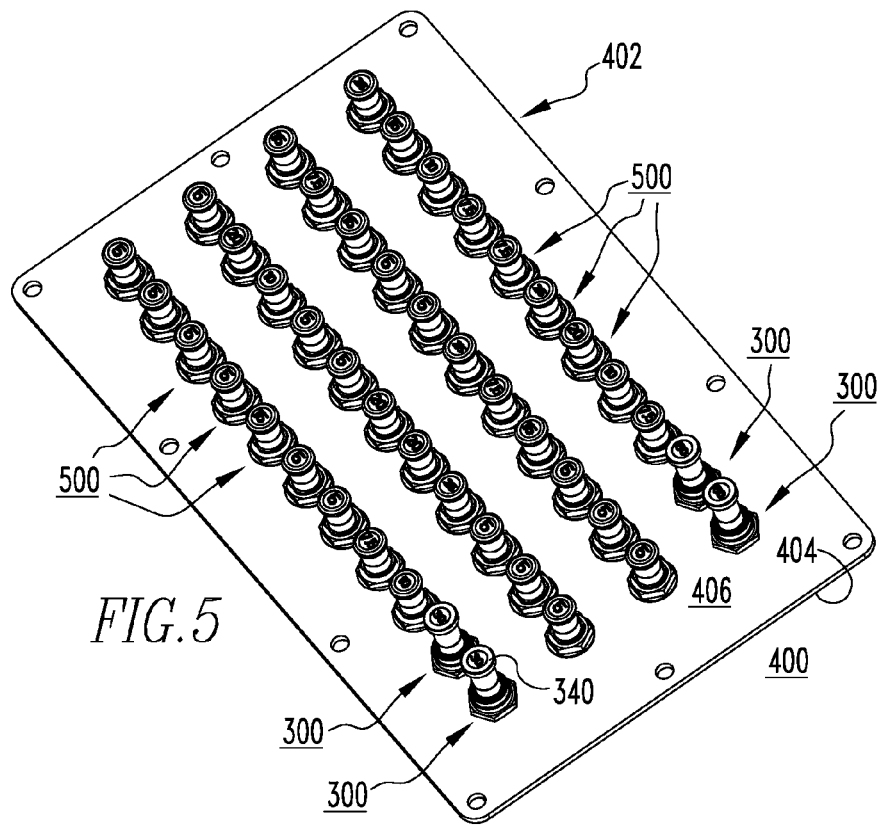
FIG. 5 is a top isometric view of the circuit protection module of the electrical system.

FIGS. 1 and 2 show a matrix assembly 100 for an electrical system such as, for example and without limitation, a power distribution unit (PDU) 2 (FIG. 1) for an aircraft (e.g., without limitation, airplane; helicopter) (partially shown in simplified form in phantom line drawing as reference 200 in FIG. 1). The power distribution unit 2 generally includes an enclosure 4 and a number of current carrying components 6,8,10,12,14, 16,18 housed by the enclosure 4. It will be appreciated that for simplicity of illustration and economy of disclosure the power distribution unit 2 in the example of FIG. 1 is shown with the cover of the enclosure 4 removed to show internal structures, and that numerous internal structures have been removed. It will also be appreciated that, while the non-limiting example matrix assembly 100 illustrated and described herein includes current carrying components in the form of electrical conductors, including electrical bus members 6,8,10,12, fuses 14,16, and electrical switching apparatus 18, such as, for example, the relay 18 shown in FIGS. 1 and 2, that any known or suitable alternative number, type and/or configuration of current carrying components other than those illustrated and described herein could be employed, without departing from the scope of the disclosed concept.

The matrix assembly 100 includes a matrix member 102 which enables the design of the power distribution unit 2 to be substantially improved over the prior art. Specifically, the matrix member 102 is a thermally conductive liquid crystalline polymer, which can be molded (e.g., without limitation, by injection molding) into any desired shape or form. In one non-limiting example embodiment, the liquid crystalline polymer is preferably CoolPoly® D5506, which is available from Cool Polymers, Inc. having a place of business at 51 Circuit Drive, North Kingstown, Rhode Island 02852. CootPoly® D5506 preferably has a thermal conductivity of about 1 W/mK to about 20 W/mK and, more preferably, a thermal conductivity of about 10 W/mK. This material is also electrically non-conductive and advantageously employs dielectric properties. Accordingly, whereas known power distribution unit designs required a separate electrical compartment and an electrically insulating backplane member made from an electrically insulating material, such as melamine or some other suitable thermoset plastic, which is not thermally conductive, the matrix member 102 of the disclosed matrix assembly 100 provides both thermal conductivity and electrical insulation in one single member, thereby eliminating the requirement for a plurality of separate structures. This, in turn, simplifies the overall design of the power distribution unit 2 and provides an advantageous weight savings. Additionally, as will be discussed in greater detail hereinbelow, the thermal conductivity of the matrix member 102. functions as a heat sink to reduce heat generated within the power distribution unit 2 by the current carrying components e.g., without limitation, electrical bus members 6,8,10,12; fuses 14,16; electrical switching apparatus 18) by removing such heat via the liquid crystalline polymer matrix member 102 to the aircraft structure 200 (FIG. 1), which is itself made of a thermally conductive material, such as aluminum. Accordingly, the temperature of the power distribution unit 2 is advantageously reduced which correspondingly reduces the electrical resistance of the current carrying components. Consequently, system performance is improved, For example and without limitation, in view of the decreased electrical resistance, it is possible to use less cooper, or other electrical conductive material, resulting in still further weight savings, and it is also possible to employ current carrying components such as, for example and without limitation, suitable electrical switching apparatus (e.g., without limitation, aircraft circuit breakers), without having to substantially de-rate them.

The matrix member 102 of the matrix assembly 100 includes a generally planar portion 104, a plurality of attachment points 106,108,110,112, and a plurality of mounting points 114,116. The attachment points 106,108,110,112 are preferably molded portions (e.g., without limitation, molded bosses) of the matrix member 102 structured to attach the current carrying components 6,8,10,12,14,16,18 to the generally planar portion 104, as shown. Similarly, the mounting points 114,116 are preferably molded portions (e.g., without limitation, molded bosses) of the matrix member 102, which are structured to attach the generally planar portion 104 to the aforementioned thermally conductive structure see, for example, die aluminum aircraft structure 200 partially shown in simplified form in phantom line drawing in FIG. 1). It will be appreciated that only some of the attachment points 106, 108,110,112 and mounting points 114,116 are shown and described herein, for simplicity of illustration and economy of disclosure. The matrix member 102 could, however, have any known or suitable alternative number, type and/or configuration of attachment points and/or mounting points, without departing from the scope of the disclosed concept.

By way of one non-limiting example, in FIGS. 1 and 2 the electrical bus member 6 is attached to the matrix member 102 of the matrix assembly 100 at attachment points 106,108 and 110. A suitable fastener 118 is employed to fasten the electrical bus member 6 to each corresponding attachment point 106 of the matrix member 102. See, for example, fastener 120 fastening electrical bus member 12 to a corresponding attachment point (hidden in FIGS. 1 and 2, but see FIGS. 3 and 4) of the matrix member, and fastener 122 fastening the fuses 14 to attachment point 112 of the matrix member 102. It will be appreciate that numerous fasteners and components (e.g., without limitation, electrical conductors; current carrying component) are not shown in FIGS. 1 and 2 for simplicity of illustration and economy of disclosure. In view of the foregoing, it will be appreciated that the current carrying components (e.g., without limitation, electrical bus members 6,8,10, 12; fuses 14,16; electrical switching apparatus 18) are, in most instances, directly attached to the matrix member 102. This is made possible by virtue of the aforementioned material properties of the preferred liquid crystalline polymer and, in particular, the combined thermal conductivity and dielectric insulative properties thereof.

Continuing to refer to FIG. 1, it will be appreciated that the enclosure 4 of the power distribution unit 2 includes an interior 20 and an exterior 22. A portion of the matrix member 102 of the matrix assembly 100 extends outwardly from the interior 20 of the enclosure 4 to the exterior 22, in order that the aforementioned mounting points 114,116 of the matrix member 102 are disposed on the exterior 22 of the enclosure 4. Accordingly, it will be appreciated that the matrix member 102 is structured to transfer heat generated by the current carrying components 6,8,10,12,14,16,18 away from such current carrying components 6,8,10,12,14,16,18, which are substantially disposed on the interior 20 of the enclosure 4, as shown. Specifically, the matrix member 102 functions as a heat sink transferring such heat through the matrix member 102 to the exterior 22 of the enclosure 4 and, in particular, through the mounting points 114,116 to the aforementioned airframe structure 200 (FIG. 1), which itself is made from a thermally conductive material, such as aluminum. Thus, the matrix assembly 100 effectively removes heat from the power distribution unit 2, reducing the operating temperature thereof and enhancing system performance while reducing weight.

The matrix member 102 preferably further includes a number of heat sink structures, which in the example shown and described herein are a plurality of protrusions or ribs 124,126, 128,130 that extend outwardly from the planar portion 104 of the matrix member 102, thereby further increasing the surface area and heat transfer capabilities of the matrix member 102. Each of the protrusions (see, for example, ribs 124,126,128, 130) is structured to extend outwardly from a corresponding one of the attachment points (see, for example, attachments points 110,112) to transfer (e.g., pipe) heat generated by the current carrying components (see, for example, electrical bus member 6 and fuse 14 of FIGS. 1 and 2) away from the current carrying components 6,14 (FIGS. 1 and 2). Preferably the ribs 124,126,128,130 ultimately extend between at least some of the attachment points 110,112 and the mounting points (see, for example, mounting point 114 and rib 130), thereby further facilitating heat transfer from the current carrying components 6,14 (FIGS. 1 and 2) through the ribs 124,126,128,130 to the mounting points 114,116 and into the thermally conductive airframe structure 200 (FIG. 1). In other words, in addition to increasing the surface area of the matrix member 102, the ribs 124,126,128,130 or other suitable heat sink structures (not shown) (e.g., without limitation, fins (not shown)) function to effectively pipe or direct heat as desired, with respect to the matrix member 102 and components attached thereto.

As shown in FIG. 2, the example electrical system 2 further includes a printed circuit board 24, wherein the electrical bus members 6,8,10,12, the fuses 14,16 and the relay 18 are attached to the first side 132 of the matrix member 102, and the printed circuit board 24 is attached to the second side 134, generally opposite the first side 132. As previously discussed, it will, however, be appreciated that the matrix assembly 100 could employ any known or suitable alternative number, type and/or configuration of electrical conductors, current carrying components, printed circuit boards, and/or other known or suitable components, without departing from the scope of the disclosed concept.

Accordingly, among other benefits, the disclosed matrix assembly 100 simplifies the overall design and complexity of the electrical system 2, reduces weight, provides effective dielectric insulation, and effectively thermally manages the electrical system 2 by transforming heat generated by current carrying components within the interior 20 of the electrical system enclosure 4 to the exterior 22 and, in particular, into the airframe structure 200 (FIG. 1), in order to advantageously utilize the substantial surface area and heat sink capabilities of the thermally conductive airframe structure 200.

The electrical system (see, for example and without limitation, aerospace power distribution unit 2 of FIG. 1) preferably further includes a number of additional unique features and structures, which will now be described. Specifically, in addition to the aforementioned matrix assembly 100, the electrical system 2 preferably further includes electrical switching apparatus such as, for example, the subminiature or aircraft circuit breakers 300 and 500, shown in FIGS. 1 and 5-8, as part of a circuit protection module 400 (FIGS. 1 and 5-8). It will, however, be appreciated that the circuit protection module 400 and electrical switching apparatus 300 therefor could be employed independently from the aforementioned matrix assembly 100 (FIGS. 1-4).

Figure 6:
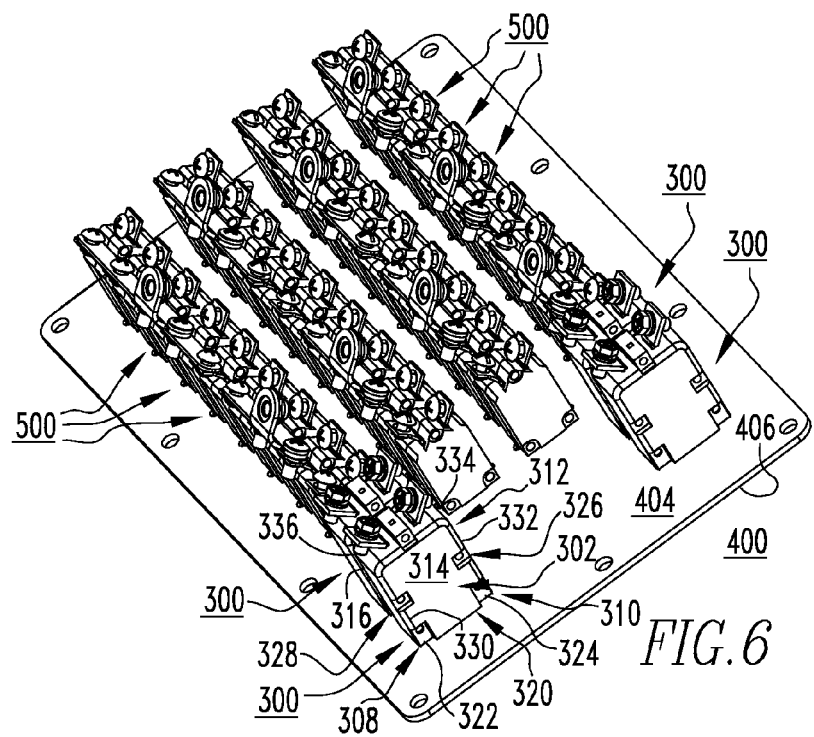
FIG. 6 is a bottom isometric view of the circuit protection module of FIG. 5.
Figure 7:
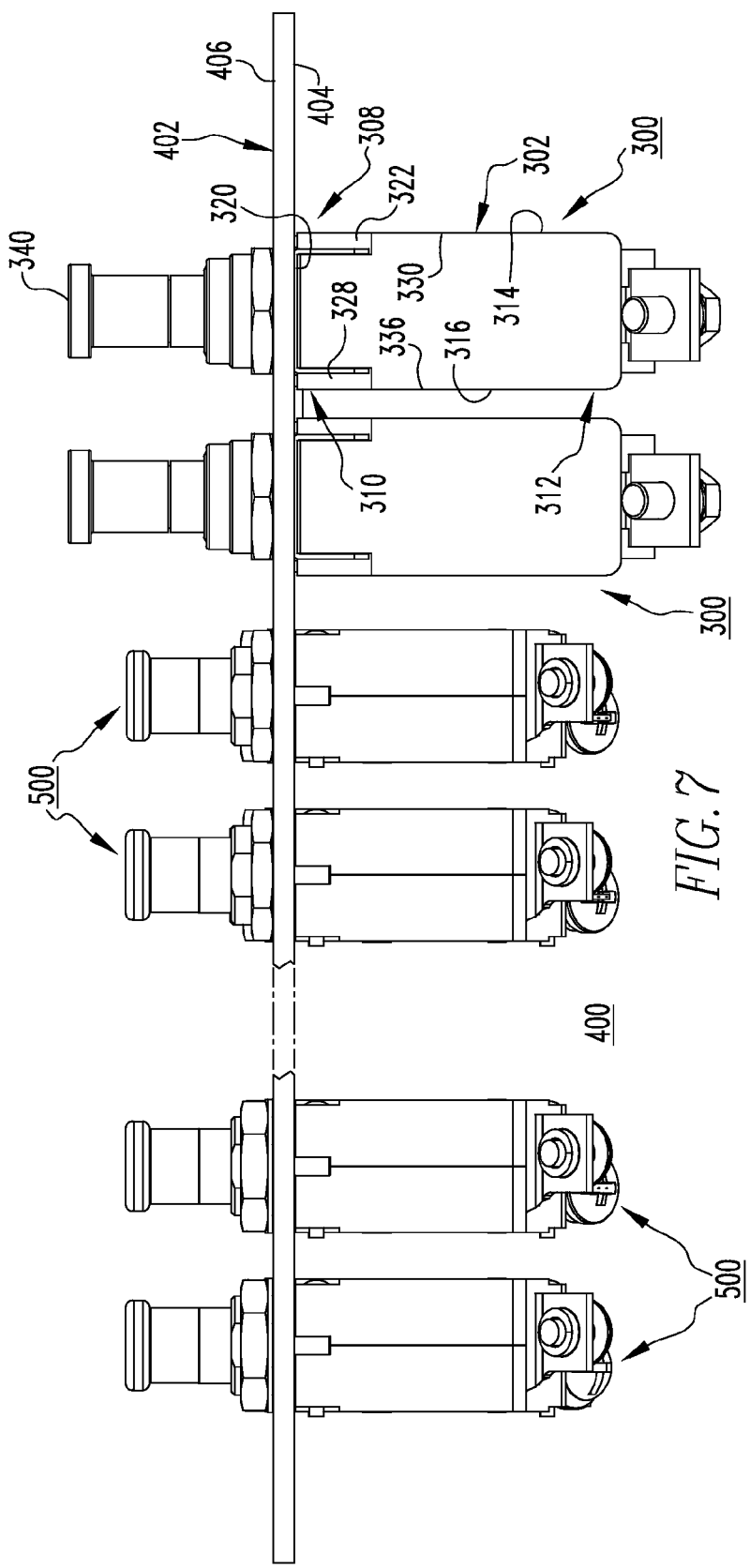
FIG. 7 is a side elevation section view of the circuit protection module of FIG. 6.
Figure 8:
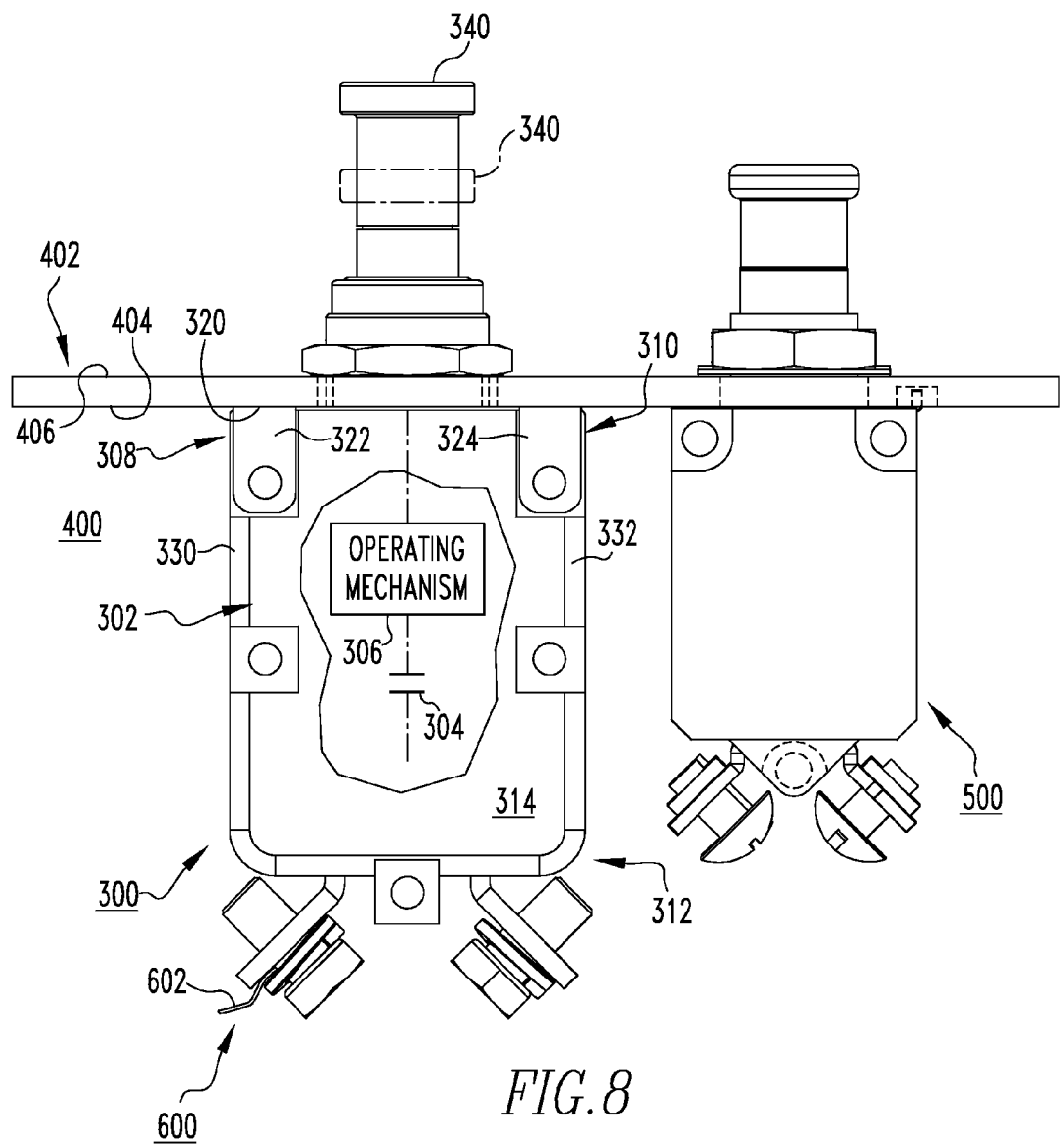
FIG. 8 is an end elevation view of a portion of the circuit protection module of FIG. 7.

As shown in FIGS. 1 and 5-8, the example circuit protection module 400 generally includes a panel member 402 and a plurality of the aforementioned electrical switching apparatus 300,500 (e.g., without limitation, subminiature or aircraft circuit breakers), which are mechanically coupled and thermally attached (e.g., in direct thermal communication with) to the panel member 402. For simplicity of illustration and economy of disclosure only one of the circuit breakers 300 will be described in detail. Specifically, as best shown in FIGS. 6-8, each of the circuit breakers 300 includes a housing 302, separable contacts 304 (shown in simplified form in FIG. 8) enclosed by the housing 302, an operating mechanism 306 (shown in simplified form in FIG. 8) for opening and closing the separable contacts 304 (FIG. 8), and a mounting element 308 structured to attach the circuit breaker housing 302 to the panel member 402.

The circuit breaker housing 302 is made from a thermally conductive liquid crystalline polymer preferably having substantially similar thermal conductivity and dielectric insulation properties as the liquid crystalline polymer (e.g., without limitation, CoolPoly D5506) previously discussed hereinabove with respect to the matrix member 102 (FIGS. 1-4). Accordingly, the thermally conductive circuit breaker housing 302 effectively transfers heat that is generated by the separable contacts 304 (FIG. 8) with the housing 302, away from the separable contacts 304 (FIG. 8), through the housing 302 and the mounting element 308, and into the panel member 402. The panel member 402 is also made from a thermally conductive material such as, for example and without limitation, aluminum. The mounting elements made from a thermally conductive material such as, for example and without limitation, aluminum. That is, the thermally conductive panel member 402 is an aluminum aircraft structure, or is attached directly or indirectly to a thermally conductive aircraft structure, in order to provide a thermal pathway and substantial surface area to transfer and therefore dissipate heat, which would otherwise be trapped within the circuit breaker housing 302. As previously discussed, by effectively controlling (e.g., without limitation, reducing) the operating temperature associated with the circuit breakers 300, the electrical resistance such as, for example and without limitation, the electrical resistance of a copper wire (see, for example, wire 602 of electrical circuit 600 partially shown electrically connected to circuit breaker 300 in FIGS. 1 and 8) or other suitable electrical conductor. Consequently, performance of the electrical switching apparatus 300 and of the electrical system 2 (FIG. 1), in general, is improved. In other words, by effectively transferring and, therefore, reducing heat associated with the circuit breakers 300 by piping (e.g., transferring) such heat into the panel member 402 and/or other aircraft airframe structures, which are thermally conductive and have substantial surface area to dissipate such heat, it is no longer necessary to de-rate the circuit breakers 300. That is, because the heat and, in turn, the electrical resistance in the electrical conductors (e.g., without limitation, copper wire 602) is controlled, a relatively smaller circuit breaker 300 can be employed because the electrical performance of the circuit breaker 300 is enhanced. This, in turn, advantageously allows for a smaller, lighter weight and more cost-effective electrical system 2 (FIG. 1) and circuit protection module 400 (FIGS. 1 and 5-8), therefor.

Continuing to refer to FIGS. 6-8, the housing 302 of the example circuit breaker 300 includes first and second opposing ends 310,312 and first and second opposing sides 314,316 (both shown in FIGS. 6 and 7). The mounting element 308 attaches the first end 310 of the circuit breaker housing 302 to the panel member 402. More specifically, the mounting element is preferably a thermally conductive mounting bracket 308 including an attachment portion 320 and a plurality of protrusions 322,324,326,328 extending outwardly therefrom. The attachment portion 320 is attached to the panel member 402. Each of the protrusions 322,324,326,328 is attached to the circuit breaker housing 302 at or about a corresponding one of the first and second sides 314,316 thereof. Thus, direct contact is provide, which centers a thermal pathway between the circuit breaker housing 302, mounting element 308 and panel member 402.

In the example shown and described herein, the mounting bracket 308 includes first, second, third and fourth protrusions 322,324,326 and 328, wherein the first protrusion 322 is attached to the first end 310 of the circuit breaker housing 302 at or about the first edge 330 of the housing 302, the second protrusion 324 is attached to the first end 310 at or about the second edge 332, the third protrusion 326 is attached to the first end 310 at or about the third edge 334, and the fourth protrusion 328 is attached to the first end 310 at or about the fourth edge 336. It will, however, be appreciated that any known or suitable alternative number and/or configuration of protrusions and/or mounting elements could be employed, without departing from the scope of the disclosed concept.

The panel member 402 of the example circuit protection module 400 includes an interior side 404 and an exterior side 406 disposed opposite the interior side 404. The operating mechanism 306 (FIG. 8) of the circuit breaker 302 includes an actuator 340, which extends outwardly from the first end 310 of the circuit breaker housing 302, and through the panel member 402, in order to be accessible on the exterior side 406 of the panel member 402, as shown in FIGS. 1, 5, 7 and 8. The actuator 340 (e.g., without limitation, push button; toggle switch (not shown)) is movable between a first position (shown in solid line drawing in FIG. 8), corresponding to the separable contacts 304 (FIG. 8) being open, and a second position (partially shown in phantom line drawing in FIG. 8), corresponding to the separable contacts 304 (FIG. 8) being closed.

Accordingly, it will be appreciated that the disclosed circuit breakers 300 are substantially disposed behind the panel member 402 of the circuit protection module 400, but are attached to and are in thermal communication with, the interior side 404 of the panel member 402. Therefore, the circuit protection module 400 functions to effectively dissipate heat from the circuit breakers 300 and reduce electrical resistance among the various electrical circuits 600 (see, for example and without limitation, electrical circuit 600 and wires 602 therefor, partially shown in FIGS. 1 and 8).

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A matrix assembly for an electrical system, said electrical system comprising an enclosure and a number of current carrying components housed by said enclosure, said matrix assembly comprising:
   a matrix member comprising a generally planar portion, a plurality of attachment points structured to attach said current carrying components to said genera planar portion, and a plurality of mounting points structured to attach said generally planar portion to a thermally conductive structure, wherein said matrix member is a thermally conductive liquid crystalline polymer,
   wherein said matrix member further comprises a number of heat sink structures,
   wherein said heat sink structures are a number of protrusions extending outwardly from said planar portion, thereby increasing the surface area of said matrix member; and wherein each of said protrusions is structured to extend outwardly from a corresponding one of said attachment points to transfer heat generated by said current carrying components away from said current carrying components, and
   wherein said number of protrusions are a plurality of ribs; and wherein said ribs extend between at least some of said attachment points and said mounting points thereby facilitating heat transfer from said current carrying components through said ribs to said mounting points and into said thermally conductive structure.

2. The matrix assembly of claim 1 wherein said thermally conductive liquid crystalline polymer has a thermal conductivity of about 1 W/mK to about 20 W/mK; and wherein said matrix member is structured to provide heat transfer and dielectric insulation, without requiring a plurality of separate structures.

3. The matrix assembly of claim 1 wherein said thermally conductive structure is an airframe structure.

4. The matrix assembly of claim 1 wherein said enclosure includes an interior and an exterior; wherein a portion of said matrix member is structured to extend outwardly from the interior of said enclosure to the exterior of said enclosure; and wherein said mounting points are structured to be disposed on the exterior of said enclosure.

5. The matrix assembly of claim 4 wherein said matrix member is structured to transfer heat away from said current carrying components disposed on the interior of said enclosure through said matrix member to the exterior of said enclosure and through said mounting points to said thermally conductive structure.

6. The matrix assembly of claim 1 wherein said matrix member further comprises a first side and a second side disposed opposite the first side; wherein said electrical system further comprises a printed circuit board; wherein said current carrying components are structured to be attached to the first side of said matrix member; and wherein said printed circuit board is structured to be attached to the second side of said matrix member.

7. The matrix assembly of claim 1 wherein said current carrying components comprise at least one of an electrical bus member, an electrical switching apparatus, and a fuse.

8. An electrical system comprising:
an enclosure;
a number of current carrying components housed by said enclosure; and
a matrix assembly comprising:
a matrix member comprising a generally planar portion, a plurality of attachment points attaching said current carrying components to said generally planar portion, and a plurality of mounting points structured to attach said generally planar portion to a thermally conductive structure,
wherein said matrix member is a thermally conductive liquid crystalline polymer,
wherein said matrix member further comprises a number of protrusions extending outwardly from said planar portion, thereby increasing the surface area of said matrix member; and wherein each of said protrusions extend outwardly from a corresponding one of said attachment points to transfer heat generated by said current carrying components away from said current carrying components, and
wherein said number of protrusions are a plurality of ribs; and wherein said ribs extend between at least some of said attachment points and said mounting points, thereby facilitating heat transfer from said current carrying components through said ribs to said mounting points and into said thermally conductive structure.

9. The electrical system of claim 8 wherein said thermally conductive liquid crystalline polymer has a thermal conductivity of about 1 W/mK to about 20 W/mK; and wherein said matrix member is structured to provide heat transfer and dielectric insulation, without requiring a plurality of separate structures.

10. The electrical system of claim 8 wherein said thermally conductive structure is an airframe structure.

11. The electrical system of claim 8 wherein said enclosure includes an interior and an exterior; wherein a portion of said matrix member extends outwardly from the interior of said enclosure to the exterior of said enclosure; and wherein said mounting points are disposed on the exterior of said enclosure.

12. The electrical system of claim 11 wherein said matrix member transfers heat generated by said current carrying components disposed on the interior of said enclosure through said matrix member to the exterior of said enclosure and through said mounting points to said airframe thermally conductive structure.

13. The electrical system of claim 8 wherein said matrix member further comprises a first side and a second side disposed opposite the first side wherein said electrical system further comprises a printed circuit board; wherein said current carrying components are attached to the first side of said matrix member; and wherein said printed circuit board is attached to the second side of said matrix member.

14. The electrical system of claim 8 wherein said current carrying components comprise at least one of an electrical conductor, an electrical bus member, an electrical switching apparatus, and a fuse.

15. The electrical system of claim 14 wherein said electrical system is a power distribution unit for an aircraft; wherein said aircraft has a thermally conductive structure; wherein said current carrying components generate heat within the interior of said power distribution unit; and wherein said matrix member of said matrix assembly transfers said heat from said power distribution unit to said structure of said aircraft.

* * * * *